(12) United States Patent
Hsu

(10) Patent No.: US 6,768,359 B2
(45) Date of Patent: *Jul. 27, 2004

(54) CHARGE-PUMP PHASE-LOCKED LOOP CIRCUIT WITH CHARGE CALIBRATION

(75) Inventor: Wei-Chan Hsu, Los Altos, CA (US)

(73) Assignee: Via Technologies, Inc., Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/279,972

(22) Filed: Oct. 25, 2002

(65) Prior Publication Data
US 2004/0012425 A1 Jan. 22, 2004

Related U.S. Application Data

(63) Continuation-in-part of application No. 10/196,182, filed on Jul. 17, 2002, now Pat. No. 6,608,511.

(51) Int. Cl.$^7$ ................................................. H03L 7/00
(52) U.S. Cl. ..................... 327/157; 327/536; 331/1 A; 363/59; 363/60
(58) Field of Search .................. 327/156, 157, 327/536, 537, 590; 331/1 A, 17, 25; 363/59, 60

(56) References Cited

U.S. PATENT DOCUMENTS

| | | | | |
|---|---|---|---|---|
| 5,473,283 A | * | 12/1995 | Luich | 331/8 |
| 5,933,037 A | * | 8/1999 | Momtaz | 327/157 |
| 6,043,715 A | * | 3/2000 | Bailey et al. | 331/2 |
| 6,222,421 B1 | * | 4/2001 | Kiyose | 331/17 |
| 6,489,851 B1 | * | 12/2002 | Miyada et al. | 331/11 |
| 6,608,511 B1 | * | 8/2003 | Hsu | 327/157 |

* cited by examiner

Primary Examiner—Timothy P. Callahan
Assistant Examiner—An T. Luu
(74) Attorney, Agent, or Firm—Rabin & Berdo, P.C.

(57) ABSTRACT

A charge-pump phase-locked loop (CP-PLL) circuit with charge calibration. The CP-PLL circuit keeps the phase of an output clock signal constant in a "locked" condition, and includes a charge-pump circuit and a calibration circuit. The charge-pump circuit provides a charge-pump output current. The charge-pump circuit also includes a transistor configured to fine tune the charge-pump output current based on a calibrate voltage signal to eliminate a net charge delivered from the charge-pump output current. The calibration circuit senses the net charge and generates the calibrate voltage signal having a value in proportion to an amount of the net charge. Under control of the calibrate voltage signal, the charge-pump circuit cooperating with the transistor regulates the net charge to become exactly zero, thereby maintaining the phase of the output clock signal locked onto the phase of the reference clock signal.

20 Claims, 5 Drawing Sheets

CHARGE-PUMP PHASE-LOCKED LOOP CIRCUIT WITH CHARGE CALIBRATION

CROSS-REFERENCE TO RELATED APPLICATION

This application is a continuation-in-part of application Ser. No. 10/196,185, filed Jul. 17, 2002 now U.S. Pat. No. 6,608,511.

BACKGROUND OF THE INVENTION

1. Field of the Invention

The invention relates to a phase-locked loop (PLL) circuit. More particularly, the invention relates to a charge-pump PLL circuit with charge calibration.

2. Description of the Related Art

Many electronic and computer systems and components have critical timing requirements that compel generation of periodic clock waveforms that are precisely synchronized with a reference clock waveform. A phase-locked loop (PLL) is one type of circuit that is widely used to provide an output signal having a precisely controlled frequency that is synchronized with the frequency of a received or input signal. Frequency synthesizers, multipliers and dividers, single and multiple clock generators, clock recovery circuits, and wireless communication devices are (but a few) examples of the manifold implementations of PLLs.

FIG. 1 illustrates a block diagram of a typical charge-pump phase-locked loop (CP-PLL) circuit 100. The CP-PLL circuit 100 includes a phase detector 110, a charge-pump circuit 120, a loop filter 130, a voltage-controlled oscillator (VCO) 140 and a frequency divider 150. The CP-PLL circuit 100 receives a reference clock signal $CLK_{ref}$ having a frequency $F_{ref}$ and generates an output clock signal $CLK_{out}$ having a frequency $F_{out}$ that is synchronized with the reference clock signal $CLK_{ref}$ in phase. The reference clock signal $CLK_{ref}$ is coupled into the phase detector 110, where it is compared with a feedback signal $CLK'_{out}$. Based on this comparison, the phase detector 110 generates a pump-up signal UP and a pump-down signal DN which, in turn, direct the charge-pump circuit 120 to either source or sink current to or from the loop filter 130 which develops a voltage $V_c$ for adjusting the output frequency of the VCO 140. The output of the VCO 140, which is the output of the CP-PLL circuit 100, is coupled to the frequency divider 150. The feedback signal $CLK'_{out}$ may be the same as the output clock signal $CLK_{out}$ from the VCO 140, or as illustrated in FIG. 1 the feedback signal $CLK'_{out}$ may be the output of the frequency divider 150. Although the frequency divider 150 is commonly used in the CP-PLL circuit 100 to divide the frequency received from the VCO 140 by N, it may be eliminated in certain applications.

The charge pump 120 generates a current $I_{CP}$ that develops the voltage $V_c$ across the loop filter 130. The current $I_{CP}$ is dependent on the UP and DN signals from the phase detector 110. When the rising edge of $CLK_{ref}$ leads the rising edge of $CLK'_{out}$, the charge-pump circuit 120 increases $I_{CP}$ to develop a larger $V_c$ across the loop filter 130 which, in turn, causes the VCO 140 to increase the frequency of $CLK_{out}$. Conversely, when $CLK_{ref}$ lags $CLK'_{out}$, the charge pump 120 decreases $I_{CP}$ to develop a smaller $V_c$ across the loop filter 130 which, in turn, causes the VCO 140 to decrease the frequency of $CLK_{out}$. When the feedback frequency $F'_{out}$ is ultimately locked onto the reference frequency $F_{ref}$, i.e. the phases of the two signals $CLK_{ref}$, $CLK'_{out}$ are aligned, the voltage $V_c$ is not adjusted and the output frequency $F_{out}$ is kept constant. In this state, the CP-PLL circuit 100 is said to be in a "locked" condition.

The charge-pump circuit 120 internally delivers a pump-up current and a pump-down current in response to the UP and DN signals. Therefore, the charge pump output current $I_{CP}$ is the sum of the pump-up and pump-down currents. Ideally, if the CP-PLL circuit 100 is "locked" and no change in the output frequency $F_{out}$ is needed, the pump-up current and the pump-down current cancel each other and no net current $I_{CP}$ is produced. Nevertheless, manufacturing process variations, ambient conditions and inherent device characteristics can cause the pump-up current and the pump-down current to mismatch. This current mismatch results in a residual charge being left on the loop filter 130 and further causes the voltage $V_c$ applied to the VCO 140 to fluctuate. As a result, the PLL output signal $CLK_{out}$ produces clock jitter. In addition to current mismatch, charge injection and loop filter leakage are sources of charge accumulation on the loop filter 130 which prevent the CP-PLL circuit 100 from being precisely locked.

In view of the above, there is a need for a charge-pump PLL that overcomes the problems of the prior art.

SUMMARY OF THE INVENTION

It is an object of the present invention to provide a CP-PLL circuit with charge calibration to eliminate a residual charge so that the CP-PLL circuit keeps its output frequency constant.

According to one aspect of the invention, a CP-PLL circuit with charge calibration includes a charge-pump circuit and a calibration circuit. The charge-pump circuit provides a charge-pump output current to cause an output clock signal's phase to track a reference clock signal's phase. The calibration circuit is made up of a sensing means for sensing a net charge delivered from the charge-pump output current and an adjusting means for generating a calibrate voltage signal. The calibrate voltage signal has a value in proportion to an amount of the net charge sensed by the sensing means. The charge-pump circuit also includes a regulating means for fine tuning the charge-pump output current based on the calibrate voltage signal to eliminate the net charge. Under control of the calibrate voltage signal, the charge-pump circuit cooperating with the regulating means regulates the net charge to become exactly zero, thereby maintaining the phase of the output clock signal locked onto the phase of the reference clock signal.

In one embodiment of the present invention, a CP-PLL circuit with charge calibration is carried out. The CP-PLL circuit includes a first charge-pump circuit and a calibration circuit. The first charge-pump circuit provides a first current to cause an output clock signal's phase to track a reference clock signal's phase. The first charge-pump circuit is comprised of a first source current mirror, a first sink current mirror and a first transistor. The first source current mirror provides a first pump-up current and the first sink current mirror provides a first pump-down current, in which the first current is the sum of the first pump-up and the first pump-down currents. The first transistor is arranged in cascade connection with the first charge-pump circuit to fine tune the first current based on a calibrate voltage signal in order to eliminate a first net charge delivered from the first current.

The calibration circuit includes a second charge-pump circuit and a charge sensing circuit. The second charge-pump circuit is configured to provide a second current to simulate the first current in a condition in which the phase of the output clock signal is locked onto the phase of the reference clock signal. A second transistor is preferably arranged in cascade connection with the second charge-pump circuit. It fine tunes the second current based on the calibrate voltage signal to eliminate a second net charge delivered from the second current. According to the first and the second net charges, the charge sensing circuit generates the calibrate voltage signal and provides it as feedback to the first and the second charge-pump circuits. Under control of the calibrate voltage signal, the first and the second charge-pump circuits respectively regulate the first and the second net charges to become exactly zero, thereby maintaining the phase of the output clock signal locked onto the phase of the reference clock signal.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
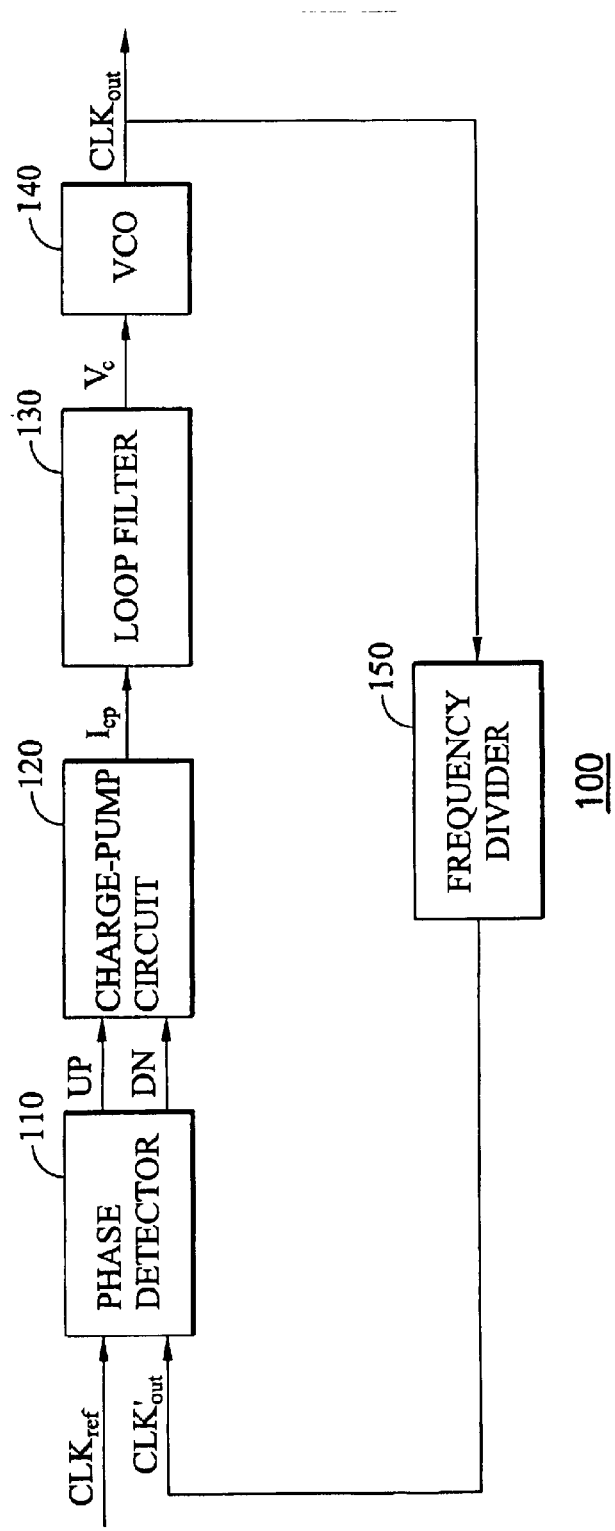
FIG. 1 is a block diagram of a CP-PLL circuit in accordance with the prior art.
Figure 2:
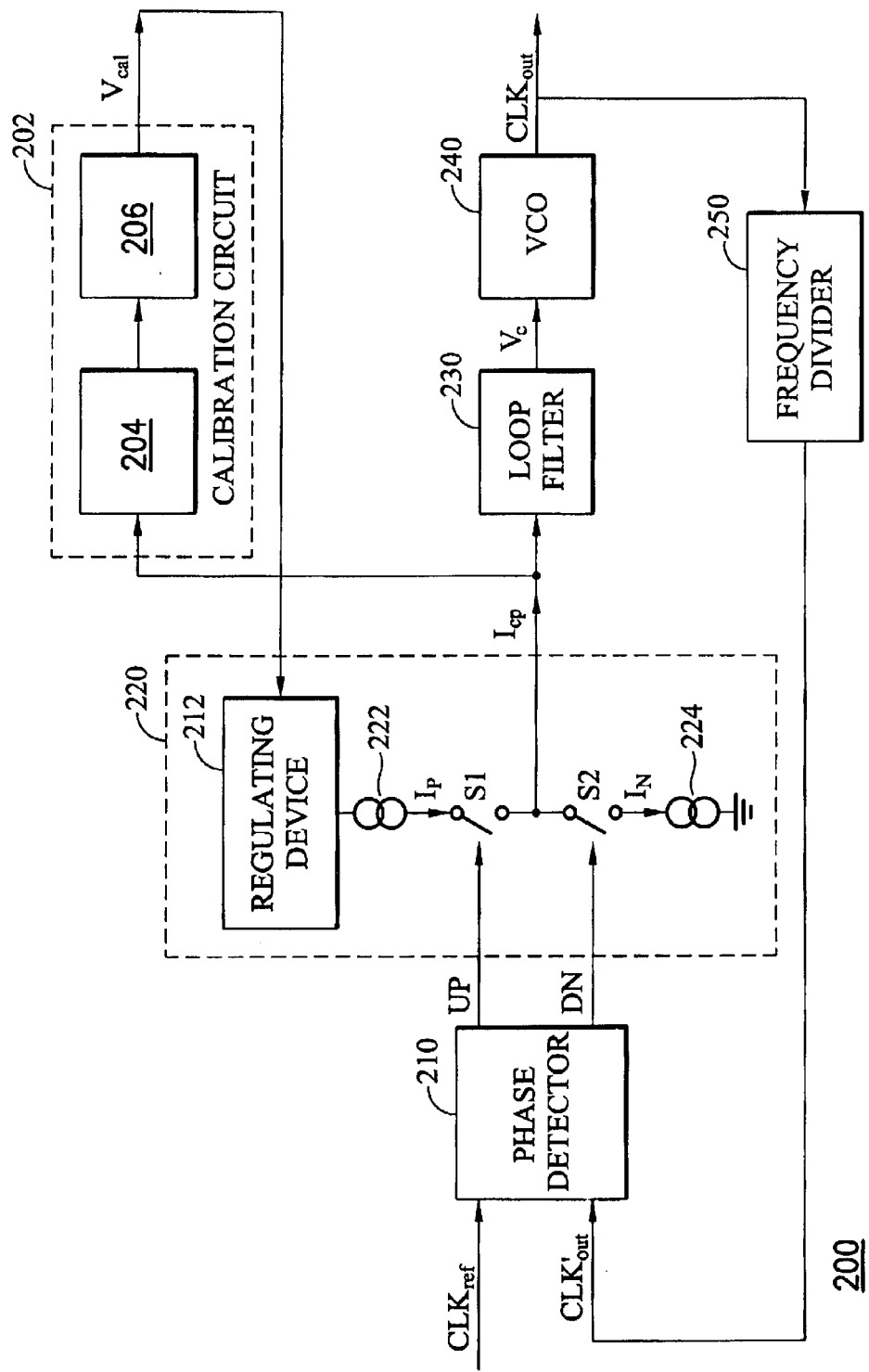
FIG. 2 is a functional block diagram showing a CP-PLL circuit in accordance with an aspect of the invention.

With reference to FIG. 2, the inventive charge-pump PLL circuit 200 includes a phase detector 210, an adjusting device 212, a charge-pump circuit 220, a loop filter 230, a VCO 240, a frequency divider 250 and a calibration circuit 202. The CP-PLL circuit 200 receives a reference clock signal $CLK_{ref}$ having a frequency $F_{ref}$ and generates an output clock signal $CLK_{out}$ having a frequency $F_{out}$ that is synchronized with the reference clock signal $CLK_{ref}$ in phase. The phase detector 210 is used to detect the phase difference between an output signal $CLK'_{out}$ of the frequency divider 250 and the reference clock signal $CLK_{ref}$ to generate a pump-up pulse UP and a pump-down pulse DN. The charge-pump circuit 220 is comprised of a "source" current mirror 222 capable of providing a pump-up current $I_P$ and a "sink" current mirror 224 capable of providing a pump-down current $I_N$, in which the output of the charge-pump circuit 220 is the sum of the pump-up and the pump-down currents. In response to the UP pulse and the DN pulse, the charge-pump circuit 220 generates a charge-pump output current $I_{CP}$ to cause the output clock signal's phase to track the reference clock signal's phase. The loop filter 230 filters the current $I_{CP}$ to provide a filtered voltage to the VCO 240 as a frequency control voltage signal $V_c$. The VCO 240 generates an output clock signal $CLK_{out}$ with variable frequency in accordance with the signal $V_c$. Further, the frequency divider 250 divides the output clock frequency $F_{out}$ by a given divide ratio. The phase detector 210, the charge-pump circuit 220, the loop filter 230, the VCO 240 and the frequency divider 250 form a CP-PLL circuit, which are well known in the art and are not described in detail herein.

With continued reference to FIG. 2, the CP-PLL circuit 200 also contains a calibration circuit 202 including a sensing means 204 for sensing a net charge $\Delta Q$ delivered from the current $I_{CP}$ and an adjusting means 206 for generating a calibrate voltage signal $V_{CAL}$. The calibrate voltage signal $V_{CAL}$ has a value in proportion to an amount of the net charge $\Delta Q$ sensed by the sensing means 204. Further, the charge-pump circuit 220 includes a regulating device 212 arranged in cascade connection with the "source" current mirror 222 as illustrated in FIG. 2. The regulating device 212 is used to regulate the pump-up current $I_P$ depending on the value of the calibrate voltage signal $V_{CAL}$, thereby fine tuning the net charge $\Delta Q$ to become exactly zero. As a result, this CP-PLL circuit 200 lends itself to maintain the phase of the output clock signal locked onto the phase of the reference clock signal precisely.

Figure 3:
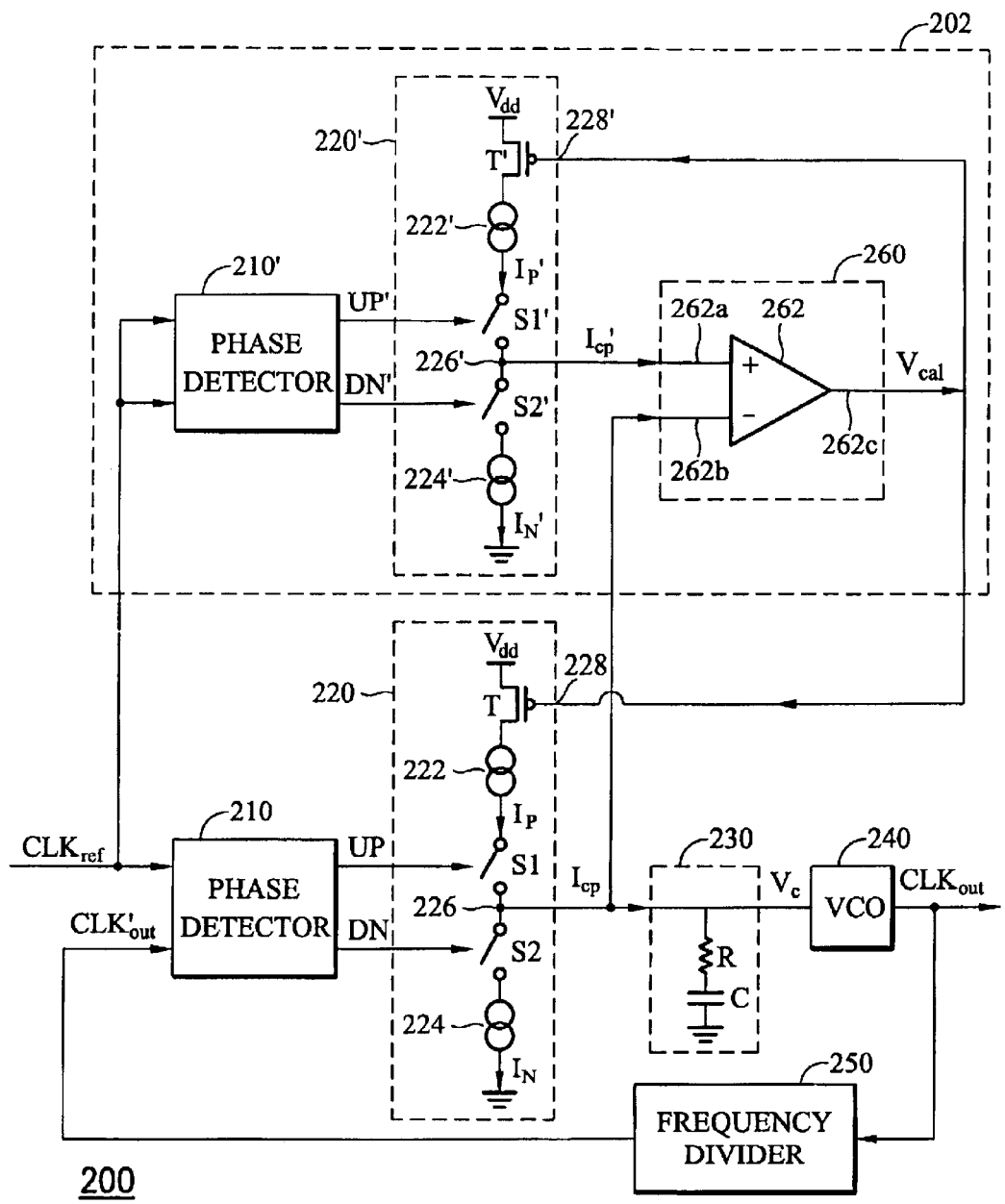
FIG. 3 is a block diagram showing a preferred embodiment of FIG. 2 in accordance with the invention.

FIG. 3 illustrates a preferred embodiment of FIG. 2 in accordance with the invention. Note that the same reference numbers identify similar elements in FIGS. 2, 3 and are not discussed herein for brevity. As depicted, the calibration circuit 202 is constructed of a phase detector 210', a charge-pump circuit 220' and a charge sensing circuit 260. The phase detector 210' has its two input terminals coupled together to receive the reference clock signal $CLK_{ref}$ so that it simultaneously generates a pump-up pulse UP' and a pump-down pulse DN' at a rate of the reference clock signal. In response to the UP' and the DN' pulses, the charge-pump circuit 220' provides a current $I'_{CP}$ to simulate the current $I_{CP}$ in a "locked" condition in which the phase of the output clock signal $CLK_{out}$ being locked onto the phase of the reference clock signal $CLK_{ref}$. To establish identical behavior and output characteristics, the charge-pump circuits 220 and 220' preferably have the same arrangement in accordance with the invention. Likewise, the phase detectors 210 and 210' are preferably arranged and manufactured in the same way. According to a net charge $\Delta Q$ delivered from the current $I_{CP}$ and a net charge $\Delta Q'$ delivered from the current $I'_{CP}$, the charge sensing circuit 260 generates a calibrate voltage signal $V_{CAL}$ and provides it as feedback to the charge-pump circuit 220 and the charge-pump circuit 220'. Under control of the calibrate voltage signal $V_{CAL}$, the charge-pump circuits 220 and 220' respectively regulate the net charge $\Delta_Q$ and the net charge $\Delta Q'$ to become exactly zero.

The features of the invention will be more clearly understood from the detailed description below. As illustrated in FIG. 3, the charge-pump circuit 220' may include a "source" current mirror 222' and a "sink" current mirror 224'. Switches S1' and S2', which can be transistors, are coupled to the phase detector 210' to be controlled by the signals UP' and DN', respectively. The charge sensing circuit 260 contains an operational amplifier (OPA) 262 having one output terminal 262c and two input terminals 262a, 262b. According to the invention, the aforementioned regulating device is representative of a semiconductor transistor. Each transistor described herein is either a P-type or N-type MOS transistor having a gate, a drain and a source. Since a MOS transistor is typically a symmetrical device, the true designation of "source" and "drain" is only possible once a voltage is impressed on the terminals. The designations of source and drain herein should be interpreted, therefore, in the broadest sense. It should be understood to those skilled in the art that other transistor technologies are contemplated to implement the transistors illustrated in FIG. 3 by the principles of the invention. In one embodiment, a transistor T' is arranged in cascade connection with the charge-pump circuit 220'. The transistor T' has its source connected to a voltage supply Vdd, its drain connected to the "source" current mirror 222', and its gate connected to a control node 228' of the charge-pump circuit 220'.

With continued reference to FIG. 3, the output terminal 262c of the OPA (operational amplifier) 262 is connected to the control node 228' of the charge-pump circuit 220' to provide the calibrate voltage signal $V_{CAL}$. The input terminal 262a of the OPA 262 is connected to a common node 226' of the switches S1' and S2' which is an output terminal of the charge-pump circuit 220' providing the current $I'_{CP}$. In similar fashion, the charge-pump circuit 220 includes Switches S1 and S2 coupled to the phase detector 210 to be turned on or off under control of the signals UP and DN, respectively. Moreover, a transistor T is arranged in cascade connection with the charge-pump circuit 220. In one embodiment, the transistor T has its source connected to the voltage supply Vdd, its drain connected to the "source" current mirror 222, and its gate connected to a control node 228 of the charge-pump circuit 220. The output terminal 262c of the OPA 262 is also connected to the control node 228 of the charge-pump circuit 220 to provide the calibrate voltage signal $V_{CAL}$. The input terminal 262b of the OPA 262 is connected to a common node 226 of the switches S1 and S2 which is an output terminal of the charge-pump circuit 220 providing the current $I_{CP}$.

In one embodiment, the phase detector 210 (210') generates the phase between the UP (UP') and DN (DN') signals to be substantially equal to the phase difference between its input terminals. When the UP pulse is applied to the switch S1, the switch S1 turns on which causes the pump-up current $I_P$ to flow into the loop filter 230. Conversely, if the DN pulse is applied to the switch S2, the switch S2 turns on which causes the pump-down current $I_N$ to flow out of the loop filter 230. The charge pump output current $I_{CP}$ is the sum of the pump-up and pump-down currents, i.e. $I_{CP}=I_P+(-I_N)$ To avoid "dead zone" problems, the UP and DN pulses generated by the phase detector 210 have a minimum width (duration) in order to ensure that the charge-pump circuit 220 has time to turn on. The "dead zone" is essentially a range of phase differences in response to which the phase detector cannot produce pulses of sufficient duration to activate the charge pump. Preferably, the phase detector 210' and the charge-pump circuit 220' operate in a similar fashion, so $I'_{CP}=I'_P+(-I'_N)$.

In FIG. 3, the loop filter 230 is illustrated with a first-order filter including a resistor R and a capacitor C. It should be understood to those skilled in the art that other suitable high-order filters are contemplated to replace the first-order filter by the principles of the invention. In the actual operation of the CP-PLL circuit of the invention, a UP pulse of width $T_P$ causes the pump-up current $I_P$ to deposit a charge equal to $(I_P T_P)$ on the capacitor C, and a DN pulse of width $T_N$ causes the pump-down current $I_N$ to remove a charge equal to $(I_N T_N)$ from the capacitor C. The pump-down current $I_P$ is ideally equal to the pump-down current $I_N$, and the Up pulse width $T_P$ is equal to the DN pulse width $T_N$ when the CP-PLL is in the "locked" condition of the CP-PLL. However, they are not perfect in practice. The net charge $\Delta Q$ delivered from the resultant current $I_{CP}$ is equal to $I_P T_P+(-I_N T_N)$, which remains on the loop filter 230 to form a residual charge.

The use of the charge-pump circuit 220' is to provide the net charge $\Delta Q'=I'_P T'_P+(-I'_N T'_N)$ to simulate the net charge $\Delta Q$ on the loop filter 230. According to the invention, the charge pumps 220 and 220' preferably have identical characteristics. The OPA 260 senses the net charge $\Delta Q'$ on the input terminal 262a and the net charge $\Delta Q$ on the other input terminal 262b. If the amount of the net charge $\Delta Q'$ is greater than zero, the OPA 260 increases the calibrate voltage signal $V_{CAL}$. The increased feedback voltage $V_{CAL}$ causes the transistors T', T to fine tune the $\Delta Q'$ and $\Delta Q'$, and decrease the respective pump-up currents $I'_P$ and $I_P$. Conversely, the OPA 260 decreases the calibrate voltage signal $V_{CAL}$ if the amount of the net charge $\Delta Q'$ is less than zero. The decreased feedback voltage $V_{CAL}$ causes the transistors T', T to increase the respective pump-up currents $I'_P$ and $I_P$. Eventually, the net charges $\Delta Q$ and $\Delta Q'$ are thus eliminated. In addition, the two input terminals of OPA 260 may track each other in potential due to the OPA 260 being in the form of "negative feedback", that is, a "virtual short circuit" exists between the two input terminals 262a, 262b. A "virtual short circuit" means that whatever voltage at terminal 262a will automatically appear at terminal 262b. As a result, the net charge $\Delta Q$ becomes zero when the net charge $\Delta Q'$ is eliminated. Since there is no residual charge left on the loop filter 230, the output clock frequency $F_{out}$ is thus maintained and the output clock signal $CLK_{out}$ is synchronized with the reference clock signal $CLK_{ref}$ in phase without clock jitter. According to the principles of the invention, it should be appreciated that the net charge $\Delta Q$ left on the loop filter 230 can be eliminated by arranging transistors in cascade connection with the "source" current mirror 222, the "sink" current mirror 224, the "source" current mirror 222' or the "sink" current mirror 224', or a combination.

Figure 4:
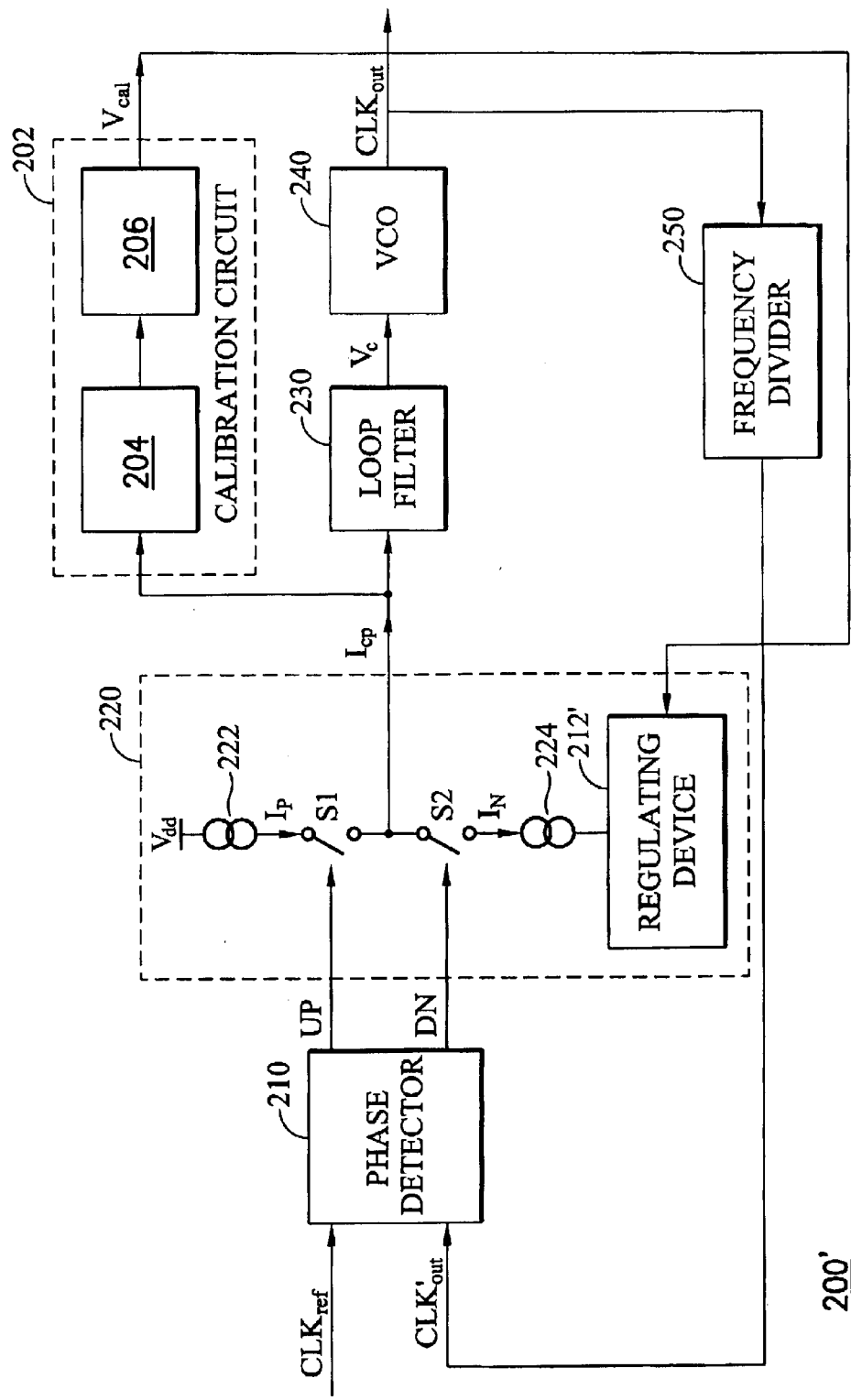
FIG. 4 is a functional block diagram showing a first modification of FIG. 2.

Turning now to FIG. 4, a first modification of FIG. 2 is illustrated. As depicted, a regulating device 212' is arranged in cascade connection with the "sink" current mirror 224. The remaining structure is similar to the functional block diagram shown in FIG. 2. The regulating device 212' is provided to regulate the pump-down current $I_N$ depending on the value of the calibrate voltage signal $V_{CAL}$, thereby fine tuning the net charge $\Delta Q$ to become exactly zero. In similar fashion, this CP-PLL circuit 200' lends itself to eliminate the residual charge left on the loop filter 230 thereby remaining stable.

Figure 5:
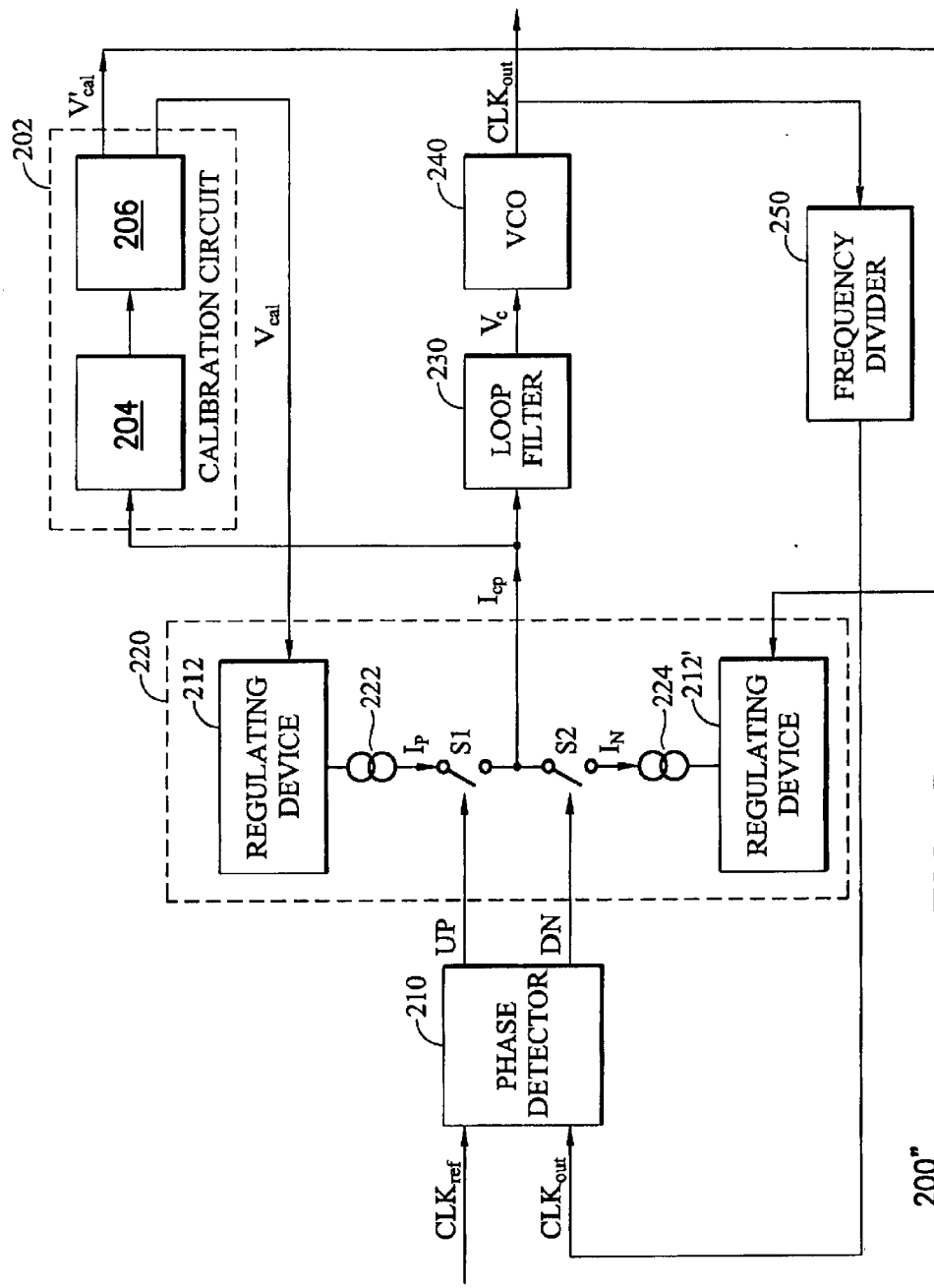
FIG. 5 is a functional block diagram showing a second modification of FIG. 2.

With reference to FIG. 5, a second modification of FIG. 2 is illustrated. As shown in FIG. 5, the regulating device 212 is arranged in cascade connection with the "source" current mirror 222. In addition, the regulating device 212' is arranged in cascade connection with the "sink" current mirror 224. Notably, the adjusting means 206 further generates another calibrate voltage signal $V'_{CAL}$ with a value in proportion to the amount of the net charge $\Delta Q$ sensed by the sensing means 204. It should be understood to those skilled in the art that the adjusting means 212 and 212' both controlled with the same calibrate voltage signal is also contemplated by the principles of the invention. The remaining structure is similar to the functional block diagram shown in FIG. 2. The regulating means 212 regulates the pump-up current $I_P$ depending on the value of the calibrate voltage signal $V_{CAL}$. On the other hand, the regulating means 212' regulates the pump-down current $I_N$ depending on the value of the calibrate voltage signal $V'_{CAL}$. Thus, the net charge $\Delta Q$ can be fine tuned to become exactly zero. This allows the output clock frequency $F_{out}$ to be maintained stably and the output clock signal $CLK_{out}$ to be synchronized precisely with the reference clock signal $CLK_{ref}$ in phase.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A charge-pump phase-locked loop circuit comprising:
   a charge-pump circuit for providing a charge-pump output current to cause an output clock signal's phase to track a reference clock signal's phase, which comprises a first regulating means for fine tuning the charge-pump output current based on a first calibrate voltage signal to eliminate a net charge delivered from the charge-pump output current; and
   a calibration circuit comprising:
      sensing means for sensing the net charge; and
      adjusting means for generating the first calibrate voltage signal having a value in proportion to an amount of the net charge sensed by the sensing means;
   wherein the charge-pump circuit cooperating with the first regulating means, under control of the first calibrate voltage signal, regulates the net charge to become exactly zero, thereby maintaining the phase of the output clock signal locked onto the phase of the reference clock signal.

2. The circuit as recited in claim 1 wherein the charge-pump circuit comprises a source current mirror for providing a pump-up current and a sink current mirror for providing a pump-down current, in which the charge-pump output current is the sum of the pump-up and the pump-down currents.

3. The circuit as recited in claim 2 wherein the first regulating means is arranged in cascade connection with the source current mirror to regulate the pump-up current depending on the first calibrate voltage signal's value, thereby fine tuning the net charge delivered from the charge-pump output current to become exactly zero.

4. The circuit as recited in claim 3 wherein the charge-pump circuit further comprises a second regulating means arranged in cascade connection with the sink current mirror to regulate the pump-down current depending on the first calibrate voltage signal's value, thereby fine tuning the net charge delivered from the charge-pump output current to become exactly zero.

5. The circuit as recited in claim 3 wherein the charge-pump circuit further comprises a second regulating means arranged in cascade connection with the sink current mirror, wherein the adjusting means further generates a second calibrate voltage signal having a value in proportion to the amount of the net charge sensed by the sensing means, the first regulating means regulates the pump-up current depending on the first calibrate voltage signal's value and the second regulating means regulates the pump-down current depending on the second calibrate voltage signal's value, respectively, thereby fine tuning the net charge delivered from the charge-pump output current to become exactly zero.

6. The circuit as recited in claim 2 wherein the first regulating means is arranged in cascade connection with the sink current mirror to regulate the pump-down current depending on the first calibrate voltage signal's value, thereby fine tuning the net charge delivered from the charge-pump output current to become exactly zero.

7. The circuit as recited in claim 2 wherein the first regulating means is arranged in cascade connection with the sink current mirror to regulate the pump-down current depending on the first calibrate voltage signal's value, thereby fine tuning the net charge delivered from the charge-pump output current to become exactly zero.

8. The circuit as recited in claim 1 further comprising:
   a divider for dividing the output clock signal's frequency by a given divide ratio;
   a voltage-controlled oscillator for generating the output clock signal with variable frequency in accordance with a frequency control voltage signal;
   a loop filter for filtering the first current to provide a filtered voltage to the voltage-controlled oscillator as the frequency control voltage signal; and
   a phase detector for detecting a phase difference between an output signal of the divider and the reference clock signal to generate a pump-up pulse and a pump-down pulse, wherein the charge-pump circuit generates the charge-pump output current in response to the pump-up and the pump-down pulses.

9. A charge-pump phase-locked loop circuit comprising:
   a first charge-pump circuit for providing a first current to cause an output clock signal's phase to track a reference clock signal's phase, which comprises:
      a first source current mirror configured to provide a first pump-up current;
      a first sink current mirror configured to provide a first pump-down current; and
      a first transistor arranged in cascade connection with the first source current mirror for fine tuning the first pump-up current based on a first calibrate voltage signal to eliminate a first net charge delivered from the first current;
   wherein the first current is the sum of the first pump-up and the first pump-down currents; and
   a calibration circuit comprising:
      a second charge-pump circuit for providing a second current to simulate the first current in a condition in which the phase of the output clock signal being locked onto the phase of the reference clock signal; and
      a charge sensing circuit for generating a first calibrate voltage signal in accordance with the first net charge and a second net charge delivered from the second current, and for providing the first calibrate voltage signal as feedback to the first transistor and the second charge-pump circuit;
   wherein the second charge-pump circuit and the first charge-pump circuit cooperating with the first transistor, under control of the first calibrate voltage signal, respectively regulate the first and the second net charges to become exactly zero, thereby maintaining the phase of the output clock signal locked onto the phase of the reference clock signal.

10. The circuit as recited in claim 9 wherein the second charge-pump circuit comprises a second source current mirror configured to provide a second pump-up current and a second sink current mirror configured to provide a second pump-down current, in which the second current is the sum of the second pump-up and the second pump-down currents.

11. The circuit as recited in claim 10 wherein the second charge-pump circuit further comprises a second transistor arranged in cascade connection with the second source current mirror, for fine tuning the second pump-up current based on the first calibrate voltage signal to eliminate the second net charge delivered from the second current.

12. The circuit as recited in claim 10 wherein the second charge-pump circuit further comprises a second transistor arranged in cascade connection with the second sink current mirror, for fine tuning the second pump-down current based on the first calibrate voltage signal to eliminate the second net charge delivered from the second current.

13. The circuit as recited in claim 11 wherein the first charge-pump circuit further comprises a third transistor arranged in cascade connection with the first sink current mirror, and the second charge-pump circuit further comprises a fourth transistor arranged in cascade connection with the second sink current mirror, for fine tuning the first and the second pump-down currents based on the first calibrate voltage signal to eliminate the first and the second net charges, respectively.

14. The circuit as recited in claim 10 wherein the second charge-pump circuit further comprises a second transistor arranged in cascade connection with the second sink current mirror, wherein the charge sensing circuit further generates a second calibrate voltage signal in accordance with the first net charge and the second net charge, the second transistor is configured to fine tune the second pump-down current based on the second calibrate voltage signal to eliminate the second net charge delivered from the second current.

15. The circuit as recited in claim 11 wherein the first charge-pump circuit further comprises a third transistor arranged in cascade connection with the first sink current mirror, and the second charge-pump circuit further comprises a fourth transistor arranged in cascade connection with the second sink current mirror, wherein the charge sensing circuit further generates a second calibrate voltage signal in accordance with the first net charge and the second net charge, the third and the fourth transistors fine tune the first and the second pump-down currents based on the second calibrate voltage signal to eliminate the first net charge delivered from the first current and the second net charge delivered from the second current, respectively.

16. A charge-pump phase-locked loop circuit comprising:
   a first charge-pump circuit for providing a first current to cause an output clock signal's phase to track a reference clock signal's phase, which comprises:
      a first source current mirror configured to provide a first pump-up current;
      a first sink current mirror configured to provide a first pump-down current; and
      a first transistor arranged in cascade connection with the first sink current mirror for fine tuning the first pump-down current based on a first calibrate voltage signal to eliminate a first net charge delivered from the first current;
      wherein the first current is the sum of the first pump-up and the first pump-down currents; and
   a calibration circuit comprising:
      a second charge-pump circuit for providing a second current to simulate the first current in a condition in which the phase of the output clock signal being locked onto the phase of the reference clock signal; and
      a charge sensing circuit for generating a first calibrate voltage signal in accordance with the first net charge and a second net charge delivered from the second current, and for providing the first calibrate voltage signal as feedback to the first transistor and the second charge-pump circuit;
   wherein the second charge-pump circuit and the first charge-pump circuit cooperating with the first transistor, under control of the first calibrate voltage signal, respectively regulate the first and the second net charges to become exactly zero, thereby maintaining the phase of the output clock signal locked onto the phase of the reference clock signal.

17. The circuit as recited in claim 16 wherein the second charge-pump circuit comprises a second source current mirror configured to provide a second pump-up current and a second sink current mirror configured to provide a second pump-down current, in which the second current is the sum of the second pump-up and the second pump-down currents.

18. The circuit as recited in claim 17 wherein the second charge-pump circuit further comprises a second transistor arranged in cascade connection with the second sink current mirror, for fine tuning the second pump-down current based on the first calibrate voltage signal to eliminate the second net charge delivered from the second current.

19. The circuit as recited in claim 17 wherein the second charge-pump circuit further comprises a second transistor arranged in cascade connection with the second source current mirror, for fine tuning the second pump-up current based on the first calibrate voltage signal to eliminate the second net charge delivered from the second current.

20. The circuit as recited in claim 17 wherein the second charge-pump circuit further comprises a second transistor arranged in cascade connection with the second source current mirror, wherein the charge sensing circuit further generates a second calibrate voltage signal in accordance with the first net charge and the second net charge, the second transistor is configured to fine tune the second pump-up current based on the second calibrate voltage signal to eliminate the second net charge delivered from the second current.

* * * * *